(12) United States Patent
Radenne et al.

(10) Patent No.: US 7,320,738 B2
(45) Date of Patent: Jan. 22, 2008

(54) METHOD FOR ENCAPSULATION OF A CHIP CARD AND MODULE OBTAINED THUS

(75) Inventors: Jean-Pierre Radenne, Paris (FR); Yannick De Maquille, Saint Germain en Laye (FR); Jean-Jacques Mischler, Cierrey (FR); Christophe Mathieu, Poissy (FR)

(73) Assignee: FCI, Versailles (FR)

( * ) Notice: Subject to any disclaimer, the term of this patent is extended or adjusted under 35 U.S.C. 154(b) by 0 days.

(21) Appl. No.: 10/511,792

(22) PCT Filed: Apr. 16, 2003

(86) PCT No.: PCT/EP03/50109

§ 371 (c)(1),
(2), (4) Date: May 9, 2005

(87) PCT Pub. No.: WO03/088139

PCT Pub. Date: Oct. 23, 2003

(65) Prior Publication Data

US 2005/0253228 A1    Nov. 17, 2005

(30) Foreign Application Priority Data

Apr. 18, 2002 (FR) .................................. 02 04899

(51) Int. Cl.
*B29C 65/00* (2006.01)
*B32B 37/00* (2006.01)

(52) U.S. Cl. ............................. 156/293; 257/E23.064; 257/678; 257/681; 235/492; 235/488; 174/52.4; 174/521; 156/252; 156/253; 156/295

(58) Field of Classification Search ........ 257/678–681, 257/E21.501, E23.064, E23.14; 235/492, 235/488, 487, 380, 451; 438/492; 29/827; 361/737, 761; 174/52.4, 521; 156/252, 156/253, 261, 293, 295, 244.12
See application file for complete search history.

(56) References Cited

U.S. PATENT DOCUMENTS

| 4,264,917 A | * | 4/1981 | Ugon ........................ 257/668 |
| 4,649,418 A | * | 3/1987 | Uden ......................... 257/679 |
| 4,701,236 A | | 10/1987 | Vieilledent ................. 156/252 |

(Continued)

FOREIGN PATENT DOCUMENTS

DE    195 43 427 A1    5/1997

(Continued)

*Primary Examiner*—Kenneth Parker
*Assistant Examiner*—Chris C. Chu
(74) *Attorney, Agent, or Firm*—Harrington & Smith, PC

(57) ABSTRACT

Method for conditioning of an electronic microcircuit designed for the production of an electronic module which can be glued by means of a simple glue or by soldering. For this purpose the microchip has a geometric shape compatible with a recess in a card provided to accommodate it and has a means serving as a mask compatible with the card. Ultimately this mask also serves to prevent an outflow of a resin coating used to protect a chip included in this type of module. The mask is glued to a support having, on a first face, the contact area, and on a second face the mask and the chip. The mask includes a window determining the placement of the chip.

6 Claims, 2 Drawing Sheets

U.S. PATENT DOCUMENTS

| | | | |
|---|---|---|---|
| 4,841,134 A * | 6/1989 | Hida et al. | 235/488 |
| 4,961,105 A * | 10/1990 | Yamamoto | 257/679 |
| 5,067,008 A * | 11/1991 | Yanaka et al. | 257/703 |
| 5,637,858 A * | 6/1997 | Hoppe et al. | 235/492 |
| 5,736,781 A * | 4/1998 | Atsumi | 257/679 |
| 5,975,420 A * | 11/1999 | Gogami et al. | 235/492 |
| 6,025,997 A | 2/2000 | Huber et al. | 361/777 |
| 6,217,685 B1 * | 4/2001 | Leydier et al. | 156/73.1 |
| 6,301,119 B1 * | 10/2001 | Thevenot et al. | 361/737 |
| 6,306,240 B1 | 10/2001 | Permingeat | 156/291 |

FOREIGN PATENT DOCUMENTS

| | | |
|---|---|---|
| EP | 0 201 952 A1 | 11/1986 |
| EP | 0 359 632 A1 | 3/1990 |
| EP | 0 412 545 A2 | 2/1991 |
| EP | 0 952 545 A1 | 10/1999 |

\* cited by examiner

METHOD FOR ENCAPSULATION OF A CHIP CARD AND MODULE OBTAINED THUS

FIELD OF THE INVENTION

BACKGROUND OF THE INVENTION

The object of the present invention is a method for conditioning electronic microcircuits in modules, each of which microcircuits is designed to receive an integrated circuit, generally called a chip, and thus forming electronic microcircuit modules. A further object of this invention is the electronic microcircuit modules thus obtained. Indeed, with the increase in production volumes of chip cards equipped with such modules, chip cards which are used more and more frequently in daily life, the processes for manufacturing these modules have been modified to meet a demand for quantity, occasionally to the detriment of the quality and reliability of the products obtained. The invention further relates to the installation of these modules in chip cards or other substrates.

Chip cards are obtained by arranging an electronic microcircuit module in a recess formed in the thickness of the card. This electronic module includes a microcircuit that presents an upper contact face having conductive areas, on one side of a visible face of the card. The other face of the electronic module bears a chip, which is then hidden in the recess of the card. The chip is secured and connected on a side opposite the upper face to a lower face of conductive areas.

With regard to the prior art, French patent no. FR-A-2 488 446 describes a compact electronic module designed to be mounted in an identification card. The module includes a chip glued by its base to a first face of a metallic plate including contact zones. The chip is connected to these contact zones by conductor wires that connect an upper part of the chip to these contact zones. The module includes a support element or substrate against which the metallic plate may be supported. The support element then includes one or more windows to allow the chip to be glued and/or connected to the metallic plate.

The gluing of the chip presents a problem, because it is not reliable in the longer term. Moreover, it requires that spots of glue be dispensed in uniform quantities and at closely defined intervals. But the presence of bubbles in the gluing plane can weaken the mechanical strength of the module obtained. In fact, in order to meet the requisite production conditions, glue is used that is capable of bonding quickly at relatively high temperatures. But these glues also cause the formation of bubbles and are therefore responsible for the instability of the chip mounting on the metallic plate.

In order to lend mechanical strength to the module, and at the same time to protect the conductor wires and the chip, a coating product is used to coat them. The coating product may be a resin, for example. This stiffens and is polymerised under the effect of heat treatment or irradiation with infrared or ultraviolet light. These coating resins present a problem in themselves. Their wettability is unstable, and depends in part on external conditions that cannot be controlled without significant expenditure. The resin deposited forms a dome of the side of the lower face, but it spreads when it is deposited because it is not yet polymerised. This spreading of the resin drop causes the mechanical strength of the module to be weakened and provides poor protection of the microchip and its conductor wires.

The flow of this drop creates difficulties because it also makes the module too wide. For the positioning of this drop it is therefore necessary to provide a periphery around the drop, in order to preserve peripheral zones for attaching the module to the card. These attachment zones are then glued to a shoulder provided in a lateral rabbet of the chip card recess.

On the other hand, a warm polymerisation resin which polymerises under the effect of ultraviolet light irradiation provides correct results in terms of wettability, thereby providing sound protection for the item it coats. But this resin does not lend sufficient mechanical strength to the module. Moreover, ultraviolet irradiation can disrupt the memory zones of the chips present on these modules.

To address this problem, solutions are known using resins that exhibit good mechanical strength qualities, and that allow the drop diameter of such a resin to be reduced. These solutions implement a barrier to retain the outflow of the drop. The barrier may be obtained for example by silk-screen printing of a silicone ring deposited on the periphery of the zone of the metallic plate that is to receive the chip. However, the efficiency of this solution is limited, and moreover it does not perfectly limit the flow of the drop if the plane is slightly inclined.

Otherwise, U.S. Pat. No. 5,989,941 describes the use of a barrier to channel the coating product and permit an improvement of the heat dissipation and the mechanical adhesion of an electronic module. Solutions incorporating such a barrier are also known by the technical name "dam & fill". The barrier is fixed on a support of the module by an adhesive layer. It is fixed in position on one side of the same support that retains the contact plate to which the chip is connected. This barrier corresponds to a film including a window having a dimension such that the contact plate forming a model of metallised circuit and the chip are both framed entirely inside this window. According to this document only the use of film including at least one conductive membrane is known. Moreover, this film is mounted on the module only after the metallic circuit has been created, and after the chip has been connected to this circuit.

The film includes for example a long strip, one of the faces of which is coated with adhesive material with an applicator. According to this document, the film is then cut to size, so that windows are formed thereby. The film windows are arranged so that they cooperate with different zones of a support, each zone including a metallic circuit and a chip connected with its circuit, the support always including tabs that enable it to be affixed to the chip card. The film is glued on the support in such manner that each window is arranged around only one circuit. Because of the thickness of the film, the window then enables the outflow of coating material to be limited when the drop of resin is deposited on the circuit with its chip.

In order to be mounted then in an identification card, the electronic module obtained according to this instruction must be coated with a specific glue that enables it to adhere to the bottom of an identification card recess, due to the very nature of the type of film used.

The difficulty with micromodules according to the state of the art consists in the fact that, even when they are furnished with a film preventing the outflow of the resin drop, they require long, painstaking and inefficient preparation stage, which corresponds to the stage of mounting the micromodule on the card. In fact, in order to mount the micromodule on the card, a second film is used, which is coated with "hot-melt" glue and has been pre-cut in a first stage to form windows therein. Then, this glue film is hot rolled onto the micromodule, and lastly in a third stage the glue of this film is activated for a final mounting of the micromodule on the card.

The first stage is inefficient because the cutting shears adhere to the glue film even after it has cooled, and prevent faster manipulation relative to the film. This first stage is therefore incompatible with the speed required for mass production of chip cards. Moreover, in order to guarantee correct positioning of the glue film on the micromodule it is necessary to provide for bead removal of one with respect to the other, which makes for a slow procedure. With a fast procedure, when the glue film lamination takes place, there is a significant rejection rate. Rejection at this stage is very expensive, since none of the rejected components can be re-used.

The use of such a glue film is necessary to achieve a production speed that is faster than processes in which each micromodule is glued individually. But the use of such a glue film is obligatory in order to be able to affix the micromodule to the bottom of its recess, even though its reliability over time is limited.

The task of the present invention is to remedy the problems described in the aforegoing by redefining the conditioning of the electronic microcircuit, in order to facilitate the subsequent card mounting of the module including this microcircuit. In this way, the efficiency of the electronic module conditioning stage is improved, and furthermore the long term reliability of the mounting of such an electronic module on a card is increased. The reliability of the finished product is increased because the reliability of the gluing of the module on the card is improved, and also because the reliability of the gluing of the chip to the back of the electronic microcircuit is improved. Effectively, the invention provides for transferring all the gluing means to the electronic microcircuit module.

SUMMARY OF THE INVENTION

The object of the invention is therefore an electronic microcircuit module including a substrate, at least one contact area on a first face of this substrate, a second face of this substrate capable of accommodating an integrated circuit, characterised in that it includes a parallelepiped shape, a first adhesive means to retain a first face of a mask in position against the second face of the substrate, the mask delimiting the parallelepiped being perforated to form a window around the integrated circuit, and a second adhesive means dispensed on a second face of the mask.

A further object of the invention is therefore a method for conditioning an electronic microcircuit module, characterised in that it includes the following stages consisting of:

creating a contact area on a first face of a substrate tape, arranging a first adhesive means between a second face of the substrate and a first face of a mask tape, to keep the mask in position against the second face, perforating the mask tape so that a mask window is facing the contact area, arranging a second adhesive means on the second face of the mask, and separating the individual module in the form of a parallelepiped.

BRIEF DESCRIPTION OF THE DRAWINGS

The invention will be better understood by reading the following description and reviewing the accompanying figures. These are presented here in exemplary form only and are not at all limiting of the invention. The figures show.

DETAILED DESCRIPTION OF THE INVENTION

Figure 1:
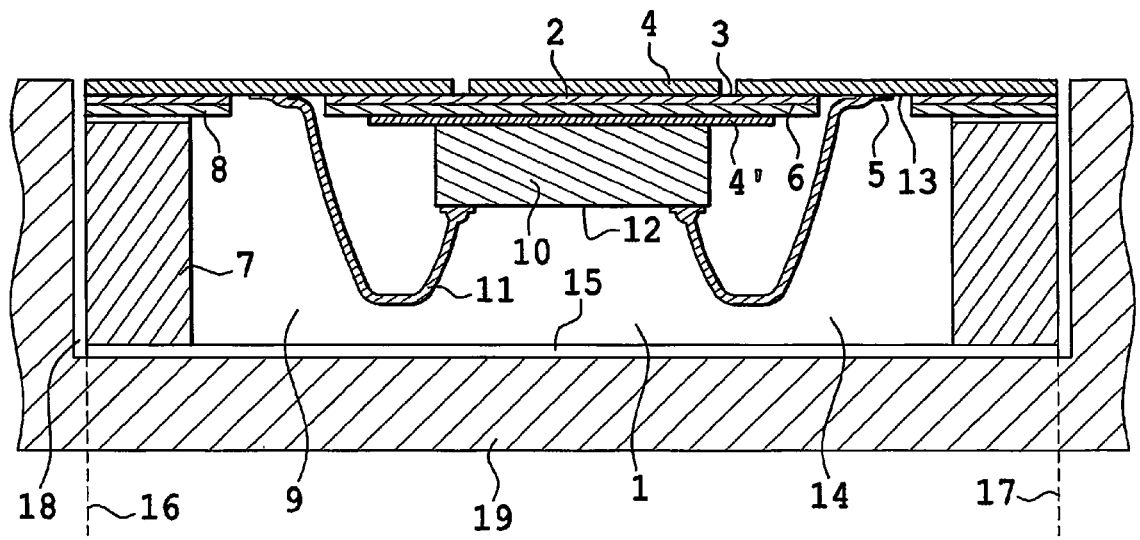
FIG. 1: a view in longitudinal cross section of an electronic module

FIG. 1 shows an electronic microcircuit module 1 according to the invention. Module 1 includes a substrate 2 forming a plane. Substrate 2 is preferably made from a dielectric material, for example from a polyester film, particularly from polyethylene terephthalate (PET), polyethylene naphthalate (PEN), or even from polyimides. In one embodiment in particular, the substrate has a thickness in the order of 25 micrometres.

On a first face 3 of substrate 2, module 1 has a contact area or metallisations or plates 4. Contact area 4 is that of a printed circuit for example. This printed circuit is obtained by laminating a layer of copper with thickness from 18 to 35 micrometres on the substrate. This copper layer is retained in position on first face 3 by a previously deposited adhesive. Substrate 2 with its copper layer is then generally engraved chemically to form the printed circuit.

Substrate 2 is also furnished with holes 5, formed through the plane formed by the substrate, and permitting the first face 3 thereof to be affixed to a second face 6. Second face 6 is opposite and parallel to first face 3.

The microcircuit module 1 includes a thick mask 7 on the side of second face 6, which is glued to this second face 6 with an adhesive means 8. Mask 7 corresponds to a film with thickness in the order of 350 micrometres and in which at least one window 9 is formed. The thickness of the mask is greater than the height of an integrated circuit 10. Window 9 is sufficiently large to allow integrated circuit 10, or chip 10, to be affixed directly to second face 6 of the substrate afterwards. Mask 7 is preferably made from a plastic polymer of type polyethylene terephthalate (PETG) or polyvinyl chloride (PVC). It may also be made from paper. The choice of the material from which mask 7 is created depends on the subsequent use of the electronic module thus designed. Effectively a material is chosen for mask 7 that allows it to be easily glued or soldered in a complementary device, for example a chip card.

In one example, adhesive means 8 has the form of a thermoplastic polymer resin layer (polyester type, for example) which may be reactivated at a moderate temperature (for example between 100° and 130° C.).

Mask 7 is created by a solid tape. In one variation this solid tape is perforated prior to mounting on second face 6. Mask 7 preferably has the form of a solid tape including several windows such as 9. The solid tape thus includes a sequence of windows 9 forming a repetitive motif and separated from one another by the solid sections situated between the windows and by continuous solid parts around the edges of the windows, in the direction of the tape. These solid sections surrounding a window 9 are intended to frame a distinct zone of substrate 2. Each distinct zone of substrate 2 corresponds to a set of contact areas such as 4 themselves. Such a set of contact areas 4, for which a window 9 of mask 7 has been correctly arranged, is intended to receive a chip such as 10.

Mask 7 must be positioned very precisely on second face 6, since its positioning is critical for the correct mounting of chip 10 on this second face and enable it to be connected to contact areas such as 4 via holes such as 5. However, since the mask is preferably deposited before chip 10 is installed, in the event of incorrect positioning the cost of this type of error is low.

A lamination technique is used in order to obtain very precise positioning of mask 7 relative to the position of the zone on which chip 10 is to be deposited and connected. For this purpose, in a preferred embodiment the tape carrying mask 7 includes lateral positioning apertures (arranged regularly along the length of the tape) forming indices through which a complementary device for advancing of the tape may engage to assure the correct positioning of mask 7 during lamination.

According to a first embodiment, in order retain perforated mask 7 in position against second face 6 of substrate 2, this second face 6 has been coated beforehand with an adhesive means 8. In this case, adhesive means 8 may even be deposited before printed circuit has been created. Moreover, adhesive means 8 may be applied to the entire second face 6, even the zones which correspond to the windows 9 of mask 7 (except at the positions of holes 5). Mask 7 is then laminated by rollers against adhesive means 8 on substrate 2.

According to a second embodiment, adhesive means 8 is deposited on one of the faces of mask 7, the face that is intended to be pressed against second face 6. Windows 9 are then created after coating with adhesive means 8, which guarantees that even distribution of the glue is assured and prevents coating the second face of the substrate. In the same way by means of a continuous lamination method between two spools, mask 7 is glued onto substrate 2. In this second case it may be necessary to provide a second adhesive means to retain chip 10 in position against this second face 6.

Figure 2:
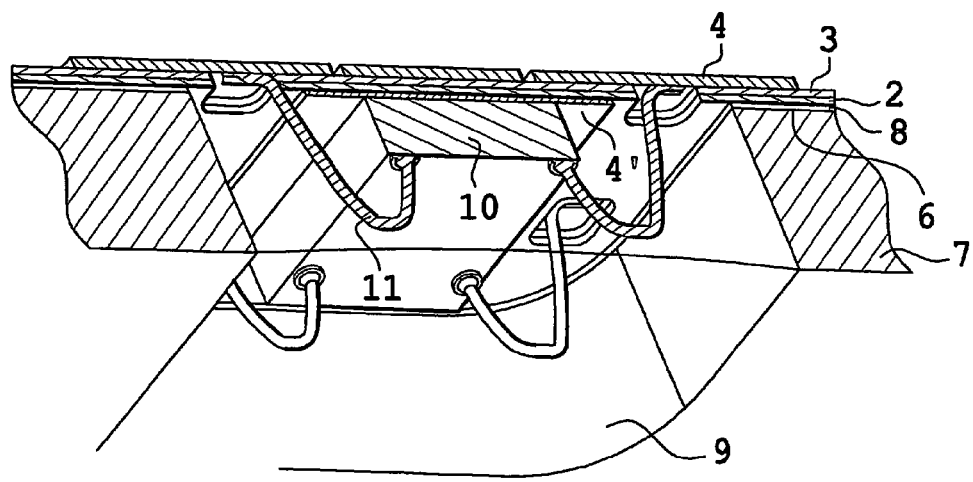
FIG. 2: a view in perspective of the underside of an electronic module according to the invention.

In a preferred embodiment, chip 10 is mounted in window 9 and glued to second face 6 of substrate 2 using first adhesive means 8. Chip 10 is preferably mounted after mask 7 has been deposited on substrate 2. In both methods, however, it might also be mounted beforehand. In order to achieve effective and secure gluing, the glue is reactivated at the spot where the chip is to be placed. In a variation, shown in FIG. 2, a second layer of glue 4' is used to glue chip 10 to substrate 2.

Afterwards, in order to connect chip 10 to contact area 4, preferably wire connection technology, called "wire bonding", is used in which an area on an upper surface 12 of chip 10 is connected to a lower face 13 of the contact areas 4 by metal, e.g. gold-plated wires 11. The wires 11 used have a diameter in the order of e.g. 20 micrometres and the connections to the two terminals are created by ultrasonic heat welding. Wires 11 pass through substrate 2 at the site of holes 5. Chip mounting by surface mounted component technology, CMS, known as "Flip chip", is also conceivable. In this case the chip is preferably mounted on the substrate before the mask is mounted.

The thickness of mask 7 is greater than the height of the chip once this is affixed to substrate 2. In this way the presence of the edges formed by the framing of the mask 7 tape ensure that chip 10 is protected. For increased protection, both chip 10 and wires 11 are coated with a resin coating 14.

Resin coating 14 is introduced in liquid form and stiffens and hardens by polymerisation. The opening of window 9 is oriented upwards for this coating. The flow of the resin 14 deposited in the cavity formed by window 9 enables the empty spaces to be filled. Polymerisation may be accelerated by heat or infrared treatment means, or possibly by ultraviolet irradiation. Resin 14 is preferably irradiated by ultraviolet waves to limit the undesirable effects on the mask if the mask is made from PVC.

The microcircuit module 1 formed in this way then has a contact face, with contact areas such as 4, and a rear face incorporating mask 7, the rear face being parallel to the contact face. To mount such a microchip 1 in a complementary device (a chip card for example), it is first necessary to equip chip 10 to form a complete electronic module, and then place the complete module in a recess of the complementary device. In the invention the recess in the complementary device seat is uniquely parallelepiped. This recess forms a simple cavity, without rabbet, such that a bottom of this recess is the same size as an individualised module. The material of the bottom of the recess is compatible with that of the mask 7. Here, compatible means that the two materials are capable of being glued securely to one another using a classic glue, or by using ultrasonic soldering techniques.

In the case that the complementary device is a chip-type identification card, it is preferably made from plastic materials compatible with those of the mask. Accordingly, cyanoacrylate-based glues may be used. Gluing may also be assured by dispensing the glue and using ultrasound vibration technology.

Starting from the tape, the modules may be separated before or after the chips are installed in each window cavity 9. In the preferred case the individual separation of microcircuit modules is performed after these chips have been mounted and window cavity 9 for each one has been filled with the coating resin.

In this preferred case, a layer 15 of glue is deposited over the whole of the tape (on the side on which chips have just been coated) after coating and before separation, this glue also being preferably the hot melt type. Then the modules are separated, for example by sawing such as 16 and 17, or by die stamping. Each module then appears as a parallelepiped rectangle, one face of which is covered with a layer 15 of glue. Such a module is then grasped by its edges, or by a suction pipette from above, by plates 4. It is then placed it in a corresponding parallelepiped recess 18 of a chip card 19 or some other chip support. Recess 18 has sheer sides, without rabbets.

In a variation, layer 15 is applied at the same time as layer 8. They are then die stamped at the same time as windows 9. Then substrate 2 is laminated against tape 7. Then chips 10 are mounted. Then coating 14 is applied, then the module is separated individually and, already pre-glued in this case too, it is mounted in cavity 18 of a chip card.

In both cases the module has the form of a parallelepiped. It does not include any tabs as in the state of the art. These tabs, which are peripheral attachment zone, were used as a means for mounting modules in rabbeted cavities of the cards. However, these tabs had the disadvantage that they caused tearing. In the invention, the chip is glued to the card from the bottom. The general and calibrated placement of glue layer 15 guarantees its thickness, and thus also simple compliance with the tolerances required for the flush evenness of areas 4 protruding above the card. The absence of tabs eliminates the problems of tearing that are otherwise encountered.

Figure 3:
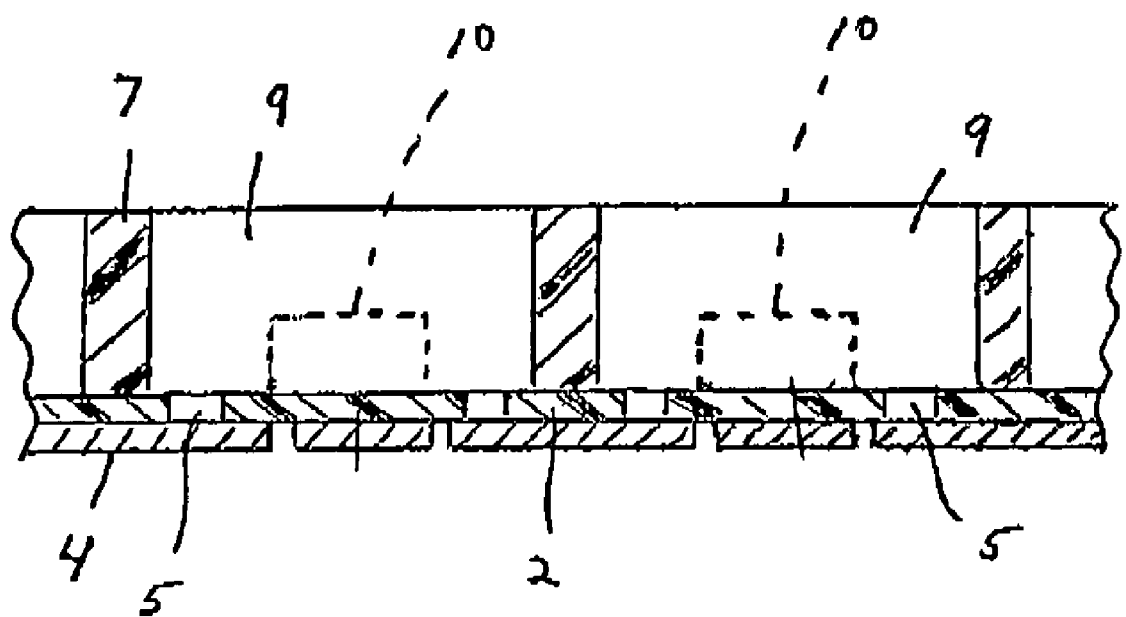
FIG. 3: a cross sectional view of a module tape with a plurality of integrated circuit chips thereon, according to the invention, mounted on a chip substrate, typically a chip card.

Thus in a first mode the mask tape 7 is laid on a substrate tape 2, the chips are placed in cavities 9, as shown in FIG. 3. As noted above, the chips are preferably mounted after the mask 7 has been deposited on substrate 2, but the chips might also be mounted before the mask is deposited on substrate 2. The chips are coated by filling the holes in the mask, layer 15 is applied and the pre-glued parallelepiped modules are separated. In this case, these layers of glue are preferably layers of hot melt type glue, which may be reactivated by heating.

In a second mode, glue layers 8 and 15 are placed on each side of a mask tape, as yet unperforated, windows 9 are created through the mask and the glue layers, the pre-glued mask is placed on a substrate 2 by aligning windows 9 correspond back of metallisations 4, the chips are installed, the chips are coated and the pre-glued parallelepiped modules are separated at this point as well.

In a variation, each glue layer may be replaced by a tape bearing glue on both sides. In a further variant, the individualised module may be glued to the bottom of a simple parallelepiped cavity of a chip card by a gluing with a cyanoacrylate glue or by ultrasound gluing of a base face of the module in this cavity bottom.

The invention claimed is:

1. A method for producing an electronic microcircuit module tape comprising the following steps performed in the following order:
    depositing an electrically conductive layer on a first face of a substrate tape, wherein the substrate tape comprises a second opposite face;
    gluing a first face of a mask tape on the second opposite face of the substrate tape; and
    concurrent with or subsequent to the step of gluing, arranging an adhesive on a second different face of the mask tape;
    wherein the mask tape comprises a window open to the second face of the substrate tape, wherein the window is sized and shaped to allow an integrated circuit to be inserted through the window and be subsequently mounted to the second face of the substrate tape after the mask tape has been attached to the substrate tape, and wherein the mask tape has a height greater than a height of an integrated circuit intended to be mounted on the second face of the substrate tape.

2. A method as in claim 1 further comprising inserting the integrated circuit through the second face of the mask tape through the window and subsequently fixing the integrated circuit against the second face of the substrate tape.

3. A method as in claim 2 wherein inserting and fixing the integrated circuit occurs after the mask tape is glued to the substrate tape.

4. A method as in claim 2 wherein the second face of the mask tape comprises a face opposite the first face of the mask tape.

5. A method as in claim 2 wherein arranging the adhesive on the second different face of the mask tape occurs before the integrated circuit is fixed to the substrate tape.

6. A method as in claim 2 wherein arranging the adhesive on the second different face of the mask tape occurs after the integrated circuit is fixed to the substrate tape.

* * * * *